(12) United States Patent  (10) Patent No.: US 8,119,528 B2
Schrott et al.  (45) Date of Patent: Feb. 21, 2012

(54) NANOSCALE ELECTRODES FOR PHASE CHANGE MEMORY DEVICES

(75) Inventors: Alejandro G Schrott, New York, NY (US); Eric A Joseph, White Plains, NY (US); Mary Beth Rothwell, Ridgefield, CT (US); Matthew J Breitwisch, Yorktown Heights, NY (US); Chung H Lam, Peekskill, NY (US); Bipin Rajendran, White Plains, NY (US); Sarunya Bangsaruntip, Mount Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 855 days.

(21) Appl. No.: 12/194,526

(22) Filed: Aug. 19, 2008

(65) Prior Publication Data

US 2010/0048020 A1  Feb. 25, 2010

(51) Int. Cl.
*H01L 21/302* (2006.01)
(52) U.S. Cl. .......... 438/689; 438/95; 438/105; 438/151; 438/692; 438/700; 438/942; 977/762; 977/888; 977/890; 977/895; 216/47; 216/88
(58) Field of Classification Search .................. None
See application file for complete search history.

(56) References Cited

U.S. PATENT DOCUMENTS

| 6,214,737 | B1 | 4/2001 | Lyons et al. |
| 6,423,475 | B1 | 7/2002 | Lyons et al. |
| 6,605,535 | B1 * | 8/2003 | Lee et al. ............ 438/684 |
| 7,122,824 | B2 | 10/2006 | Khouri et al. |
| 7,332,370 | B2 | 2/2008 | Chang et al. |
| 7,700,934 | B2 * | 4/2010 | Bakkers et al. ........... 257/2 |
| 2003/0209802 | A1 | 11/2003 | Awano |
| 2004/0051161 | A1 | 3/2004 | Tanaka et al. |
| 2004/0053475 | A1 | 3/2004 | Sharma |
| 2004/0109351 | A1 | 6/2004 | Morimoto et al. |
| 2004/0211953 | A1 | 10/2004 | Khouri et al. |
| 2004/0251551 | A1 * | 12/2004 | Hideki ................ 257/758 |
| 2006/0032329 | A1 | 2/2006 | Rubinstein et al. |
| 2006/0131555 | A1 | 6/2006 | Liu et al. |
| 2006/0204898 | A1 | 9/2006 | Gutsche et al. |
| 2007/0012956 | A1 | 1/2007 | Gutsche et al. |
| 2007/0045604 | A1 | 3/2007 | Liu et al. |
| 2007/0096071 | A1 | 5/2007 | Kordys, II et al. |
| 2007/0120104 | A1 | 5/2007 | Ahn et al. |
| 2007/0158697 | A1 | 7/2007 | Choi et al. |
| 2007/0210296 | A1 | 9/2007 | Cote et al. |
| 2007/0252127 | A1 | 11/2007 | Arnold et al. |
| 2007/0257246 | A1 | 11/2007 | Bakkers et al. |
| 2008/0247226 | A1 * | 10/2008 | Liu et al. ............... 365/163 |
| 2009/0200536 | A1 * | 8/2009 | Van Schaijk et al. ......... 257/4 |
| 2011/0122682 | A1 * | 5/2011 | Elmegreen et al. ......... 365/163 |

FOREIGN PATENT DOCUMENTS

DE  WO2007093190  8/2007

* cited by examiner

*Primary Examiner* — Anita Alanko
(74) *Attorney, Agent, or Firm* — Vazken Alexanian (57) ABSTRACT

A process for preparing a phase change memory semiconductor device comprising a (plurality of) nanoscale electrode(s) for alternately switching a chalcogenide phase change material from its high resistance (amorphous) state to its low resistance (crystalline) state, whereby a reduced amount of current is employed, and wherein the plurality of nanoscale electrodes, when present, have substantially the same dimensions.

1 Claim, 6 Drawing Sheets

NANOSCALE ELECTRODES FOR PHASE CHANGE MEMORY DEVICES

The present invention relates to a process for preparing a nanoscale electrode or diode for a phase change memory device by using sublithographic techniques. The nanoscale electrode allows for the reduction of current required to reversibly switch a chalcogenide phase change material in a memory device from a high resistance (amorphous) state to a low resistance (crystalline) state.

BACKGROUND OF THE INVENTION

Phase change memory devices are employed in many areas of information storage. Presently, phase change memory devices, especially nonvolatile memory cells, are being scaled down to the 45 nanometer node and lower. For scaled down devices, the amount of current required to melt and modulate the chalcogenide phase change material must be reduced. Chalcogenide material useful in phase change memory devices can be germanium-antimony-tellurium (GST). Instead of employing GST, other chalcogenide materials can be used as the phase change material in the memory devices.

Reduction of current can be accomplished in two ways. A first method of reducing current is by decreasing the size of the contact electrode or diode. The contact electrode or diode is the contact that meets the chalcogenide material. In the alternative, the contact, which can be an electrode or a diode, can be located adjacent to a heating element. The heating element then directly contacts the phase change material. The contact electrode or diode extends from a base electrode. In a second method, the volume of the phase change material itself can be reduced.

The first method of reducing current requires consistency in lithographic methods employed in forming the downsized electrodes. The first method of reducing current also requires efficient methods of depositing contact material over the base electrode.

WO 2007093190 discloses a nonvolatile memory cell comprising a phase change material for storing information. The phase change material is electrically contacted with ends of carbon nanotubes at specific contact regions. The carbon nanotubes have an upper surface coating made of an electrically conductive material. Contact regions that have a small surface area are obtained. Said contact regions are prepared in an efficient and reproducible manner.

US Patent Application Publication No. 2007/0158697 discloses a method for fabricating a phase change memory device comprising disposing a catalyst for forming a plurality of carbon nanotubes over predetermined regions of the current source electrode supplying external current necessary for inducing a phase change; vertically growing carbon nanotubes using the catalyst as a seed to thereby form the carbon nanotube electrodes; depositing an insulation layer over the current source electrode in a manner to cover the carbon nanotube electrodes; polishing the insulation layer until the insulation layer is flushed with the carbon nanotube electrodes; depositing a heat generating resistance layer in contact with the carbon nanotube electrodes exposed substantially at the same level of the planarized insulation layer; and forming a phase change material layer over the heat generating resistance layer. See paragraph [0105] of the application.

US Patent Application Publication No. 2007/0012956 discloses a method for fabricating a memory cell device. The method comprises providing a preprocessed wafer having a landing pad; depositing a first insulation material layer over the preprocessed wafer; depositing a second insulation material layer over the first insulation material layer; applying a photoresist layer over the second insulation material layer; etching an opening through the second insulation material layer and the first insulation material layer to expose the landing pad; depositing a catalyst material layer over the photoresist layer and the landing pad; removing the photoresist layer and the catalyst material layer on the photoresist layer leaving the catalyst material layer on the landing pad; growing a first electrode selected from the group consisting of a nanotube, a nanowire, and a nanofiber on the catalyst material layer; depositing a third insulation material layer over exposed portions of the second insulation material layer, the first insulation material layer, the landing pad, and the first electrode; planarizing the third insulation material layer to expose the second insulation material layer; depositing phase-change material over the second insulation material layer, the third insulation material layer, and the first electrode; depositing electrode material over the phase-change material; and etching the phase-change material and the electrode material to form a second electrode and a storage location. See claim 28 of the publication.

US Patent Application Publication No. 2006/0131555 discloses a method of forming a memory element. The method comprises forming a first electrode comprising at least one conductive nanostructure; forming a second electrode; and forming a resistance variable material layer between the first and second electrodes, the first electrode formed electrically coupled to the resistance variable material. The first electrode can be a nanowire. See claim 33 of the publication.

US Patent Application Publication No. 2004/0251551 discloses a method for forming an integrated circuit phase changeable memory device. The method comprises forming a lower conductive pattern on an integrated circuit substrate; forming an insulating layer on the substrate, the insulating layer having a contact hole exposing the lower conductive pattern; growing a carbon nanotube on the lower conductive pattern exposed by the contact hole; forming a supporting insulating layer on the insulating layer and the carbon nanotube; planarizing the supporting insulating layer to expose the carbon nanotube; and forming a phase changeable material pattern and an upper conductive pattern on the carbon nanotube that is exposed. See claim 27 of the publication.

US Patent Application Publication No. 2004/0211953 discloses an electronic PCM device. The device comprises a body of semiconductor material having lower surface; a dielectric layer extending on top of the body; and a PCM memory cell that includes a PCM storage element formed in the dielectric layer and a selection element, the storage element being formed by a heater element and a storage region, the storage region being of chalcogenic material and being in electric contact with the heater element, wherein the heater element has an end face extending transversely to the lower surface and forming a contact area with the storage region. See claim 16 of the publication.

U.S. Pat. No. 7,122,824 discloses an electronic PCM device. The device comprises a body of semiconductor material having a lower surface; a dielectric layer extending on top of the body; and a PCM memory cell that includes a PCM storage element formed in the dielectric layer and a selection element, the storage element being formed by a heater element and a storage region, the storage region being of chalcogenic material and being in electric contact with the heater element, wherein the heater element has an end face extending transversely to the lower surface and forming a contact area with the storage region, wherein the selection element is formed in the body, a lower electrode extends in the dielectric layer between the selection element and the heater element and an upper electrode extends in the dielectric layer on the storage region and forms a bit line. See claim 11 of the '824 patent.

None of the above references, taken either together or separately, serve to anticipate the present invention as disclosed and claimed below.

SUMMARY OF THE INVENTION

The present invention relates to a nanoscale electrode or diode for phase change memory devices, and a process for preparing said electrode or diode in a consistent manner. The nanoscale electrode or diode allows for a reduced amount of current for switching a chalcogenide phase change material from its high resistance (amorphous) state to its low resistance (crystalline) state in an alternating manner. The amorphous state is known as RESET, and the crystalline state is known as SET.

In an embodiment of the present invention, a process comprises producing an initial overhang-type pore cell, wherein an overhang is formed in a bilayer dielectric structure disposed on top of a bottom electrode positioned within a substrate. The overhang-type pore is formed by any suitable lithographic means known to one of ordinary skill in the art. One such means is ebeam lithography. A nanoscale electrode or diode is then readily grown from a catalytic material deposited in the aperture formed in the underlying layer. Finally, a phase change material and a top electrode are added to obtain a phase change memory device containing a nanoscale electrode.

DETAILED DESCRIPTION OF THE INVENTION

A method for fabricating a semiconductor device having uniform sized sub-lithographic features includes forming a first layer on an underlying layer, forming a hardmask on the first layer, patterning holes through the hardmask and first layer, and forming an overhang extending over sides of the holes by selective chemical etch to form the overhang-type hole or pore cell.

Once the overhang-type pore cell is formed, a monolayer of catalytic material is deposited on the top of the dielectric layer and the bottom of the pore cell. The catalytic material is useful in the growing of nanotubes and nanowires. The thickness of the monolayer of catalytic material is about 1.5 nanometers to about 2.5 nanometers. The preferred thickness of the catalytic monolayer is about 2.15 nanometers. The catalytic material is a member selected from the group consisting of gold, nickel, iron and palladium. The monolayer of catalytic material does not reach to the sidewalls of the overhang-type pore cell because of the overhang, which acts as a shadow mask. The catalytic monolayer covers substantially the same area at the bottom of each of the plurality of pore cells. The monolayer of catalyst material is then protected with NFC. The NFC protect completely covers the top of the dielectric layer and fills the overhang-type pore cell, thus covering the monolayer of catalytic material and forming an NFC protected assembly. NFC refers to a family of fluoropolymers. A first chemical-mechanical polishing (CMP) operation is then performed on the NFC protected assembly, landing on the hard mask surface, and thus removing substantially all of the catalytic material from the areas that are not at the bottom of the overhang-type pore cell. The process then comprises stripping the NFC protect layer.

The monolayer catalytic layer at the bottom of each of the overhang-type pore cells is then annealed to obtain a catalytic seed material having a spherical shape. The catalytic seed material is employed in a process for growing a doped nanowire comprising a P-N junction. One such process for growing nanowires comprises a vapor phase growth in the presence of an inert gas. Silane vapors, for example, can be employed. The reaction is conducted in a vacuum at a temperature of about 300 degrees C. to about 500 degrees C. When a plurality of overhang-type pore cells is employed, then a plurality of nanowires is obtained. Each nanowire has substantially the same dimensions. A single nanowire is grown in each overhang-type pore cell.

After formation of the nanowire, an oxide material is employed in a fill-in step. A second CMP step is then performed to obtain a conductive nanowire. The final steps of constructing the phase change material device are: addition of a chalcogenide phase change material, and addition of a top electrode material to obtain the device. The present invention also relates to a PCM (phase change material) device prepared according to the process as disclosed above. The process can provide for the construction of a 3-dimensional contact electrode because the growth of the nanowire is conducted at a relatively low temperature. In one embodiment, the relatively low temperature is about 500 degrees C.

An example of a process for preparing an overhang-type pore cell is as follows. A substrate or underlying layer may include silicon, silicon on insulator, gallium arsenide, germanium, an interlevel dielectric, conductors in a dielectric layer, or any other layer where vias, studs, plugs or contacts are to be connected to or placed within. A dielectric layer is deposited or otherwise formed on the substrate or underlying layer. The dielectric layer includes an oxide, such as a form of silicon oxide, or any other dielectric material. A hardmask layer, preferably formed of silicon nitride, is formed over the dielectric layer.

The hardmask layer is then covered with an organic polymeric photoresist material. The process then comprises printing and etching holes at desired locations by employing the photoresist and conventional lithographic or ebeam lithography, along with etching techniques. Etching penetrates the hardmask and dielectric layer. The etching process stops on the underlying layer.

The resist material is then stripped. The dielectric layer, preferably of silicon dioxide, is laterally etched, undercutting un-etched portions of the hardmask. In a preferred embodiment, the etch amount is about one half of the desired final hole dimension. The etch amount can be 1-5 nanometers, depending on the final target size. The etch process selected should be selective to the underlying material and to the hardmask. In a preferred embodiment, the etching process is chemical oxide removal (COR). The etching tolerance may be controlled to be between about 1% to about 5%. The portions etched back in the dielectric material cause the hardmask to overhang.

Once the overhang-type pore cell is formed, a monolayer of catalytic material is deposited on the top of the dielectric layer and the bottom of the pore cell. The thickness of the monolayer of catalytic material is about 1.5 nanometers to about 2.5 nanometers. The preferred thickness of the catalytic monolayer is about 2.15 nanometers. The catalytic material is a member selected from the group consisting of gold, nickel, iron and palladium. The monolayer of catalytic material does not reach to the sidewalls of the pore cell because of the overhang. The overhang acts as a shadow mask. The monolayer has substantially the same area at the bottom of each of the pore cells. The monolayer of catalytic material is then protected with NFC. The NFC protect completely covers the top of the dielectric layer and fills the pore cell, thus covering the monolayer of catalytic material and forming an NFC protected assembly. NFC refers to a family of fluoropolymers. A first chemical-mechanical polishing (CMP) operation is then performed on the NFC protected assembly, landing on the hard mask surface, and thus removing substantially all of the catalytic material from the areas that are not at the bottom of an overhang-type pore cell. The process then comprises stripping the NFC protect layer. The monolayer catalytic layer at the bottom of each pore cell is then annealed to obtain a catalytic seed material having a spherical shape. The catalytic seed material is employed to grow a doped nanowire comprising a P-N junction. When a plurality of pore cells is employed, then a plurality of nanowires is obtained. Each nanowire of the plurality has substantially the same dimensions. A single nanowire is grown in each pore cell.

After formation of the nanowire, an oxide material is employed in a fill-in step. A second CMP step is then performed to expose the top end of the nanowire. The final steps of constructing the phase change material device are: addition of a chalcogenide phase change material, and addition of a top electrode material to obtain the device. The present invention also relates to a phase change memory (PCM) device prepared according to the process as disclosed above.

In another embodiment of the present invention, a process for preparing a phase change memory device containing a ring electrode is disclosed. The process comprises producing an initial overhang-type pore cell by suitable lithographic means known to one of ordinary skill in the art. In an alternative embodiment, a plurality of overhang-type pore cells is constructed by employing lithographic means known to one of ordinary skill in the art. A bottom electrode is positioned within the substrate before the construction of the overhang-type pore cell. A dielectric layer surrounds the sides of the bottom electrode and covers the top of the bottom electrode. The overhang-type pore cell extends through the dielectric top layer(s) and downwardly to the upper surface of the bottom electrode. In one embodiment, the formed pore cells are substantially uniform in size. In an alternative embodiment, the formed pore cells are not uniform in size.

Once the pore cell(s) is formed, a monolayer of catalytic material is deposited on the top of the dielectric layer(s) and the bottom of the pore cell. The monolayer of catalytic material preferably comprises an element selected from the group consisting of gold, nickel, iron and palladium. The catalytic material does not reach to the sidewalls of the pore cell because of the overhang. The overhang acts as a shadow mask. The catalytic material has substantially the same area at the bottom of each pore cell. The thickness of the monolayer of catalytic material is about 1.5 nanometers to about 2.5 nanometers. The preferred thickness of the catalytic monolayer is about 2.15 nanometers. The monolayer of catalytic material is then protected with NFC. The NFC protect completely covers the top of the dielectric layer(s) and fills the pore cell, thus covering the monolayer of catalytic material to form an NFC protected assembly. A first chemical-mechanical polishing (CMP) process is then performed on the NFC protected assembly to remove substantially all of the catalytic material from the areas that are not at the bottom of the overhang-type pore cell. The next process step comprises stripping the NFC protect layer. The monolayer catalytic material is then annealed to obtain a catalytic seed material for growing nanowires. The seed material has a substantially spherical shape.

The catalytic seed material is then employed to grow a silicon nanowire, which is then oxidized. After the oxidation step, the nanowire becomes a dielectric material. A step of metal deposition is then employed to coat the oxidized silicon nanowire. The metal deposition substantially encapsulates the oxidized silicon nanowire in a metal. The process then comprises the step of reactive ion etching (RIE) to obtain an oxidized silicon nanowire. The sides of the nanowire are coated with a metal. The metal forms a substantially cylindrical ring structure. The ring structure can operate as a ring electrode in the completed semiconductor device. An oxide material is then employed in a fill-in step of the process. The oxide material substantially covers the top of the fabrication comprising the various layers, including the base electrode and the nanowire. A second CMP step is then performed to expose the top end of the nanowire. A phase change material device comprising a ring electrode is then constructed by addition of a chalcogenide phase change material, preferably GST, and a top electrode material.

In an alternative embodiment, following the growth of the silicon nanowire and the oxidation of said nanowire, the oxidized nanowire is coated with silicon nitride. The silicon nitride material covers substantially the entire top of the fabrication which comprises the various layers, including the bottom electrode and the nanowire. A second CMP step is then conducted to obtain a silicon oxide nanowire substantially surrounded by silicon nitride. A wet etch step is then performed to selectively dissolve the silicon oxide nanowire and obtain a via (hole) in the fabrication. The via or hole can then be filled with a chalcogenide material such as GST or the like. In the alternative, the via or hole can be filled with an electrode material such as titanium nitride using a CVD (chemical vapor deposition) process. The present invention also relates to a phase change memory (PCM) device prepared according to the process as disclosed above.

In another embodiment of the present invention, a process for preparing a contact electrode for a PCM device is disclosed. The process comprises obtaining a semiconductor device that has advanced beyond the front-end-of-the-line (FEOL) fabrication steps. The device is thus a middle-of-the-line semiconductor device. A first layer comprising silicon oxide material is formed on the semiconductor device. The silicon oxide material has at least one bottom electrode embedded therein. The bottom electrode is embedded in the silicon oxide layer by means known to one of ordinary skill in the art and as such forms no part of the present invention. The bottom electrode is then coated with a monolayer of catalytic material by means known to one of ordinary skill in the art. The catalytic material is a member selected from the group consisting of gold, nickel, iron and palladium. A first layer comprising silicon nitride material is then formed over the bottom electrode containing the overcoated monolayer. A second layer, co-extensive with the first layer, is formed over the first layer. The second layer comprises silicon oxide. A third layer comprising silicon nitride material is then formed on the second layer. The third layer is co-extensive with the second layer.

The third layer is then modified by coating said layer with a photoresist material and subsequently forming a lithographic feature on the third layer. Subsequent reactive ion etching results in the formation of a lithographically defined feature. The feature is modified by performing a selective wet etch with dilute hydrofluoric acid to obtain an overhang of silicon nitride. Deposition of a conformal layer of amorphous silicon or the like can be performed to form a keyhole structure. Preferably, a keyhole pore forming process is employed as disclosed in a journal article entitled: NOVEL LITHOGRAPHY-INDEPENDENT PORE PHASE CHANGE MEMORY, Breitwisch et al, 2007 Symposium on VLSI Technology, 12-14 Jun. 2007, pp. 100-101. The keyhole pore forming process comprises: (1) obtaining a stack comprising $SiN—SiO_2—SiN$, (2) lithographically defining a hole in the stack, stopping on the top of the bottom SiN layer, (3) selectively wet etching the lithographically defined hole to recess the $SiO_2$ layer and create an overhang in the upper SiN layer, and (4) depositing a highly conformal poly-silicon film. The film pinches off at the upper SiN layer to produce a keyhole in the poly-silicon. The conformal nature of the poly-silicon film results in a keyhole whose diameter is equal to the recess of the $SiO_2$ layer. The keyhole pore forming process further comprises: (5) transferring the keyhole into the bottom SiN layer to define the pore, and (6) wet etching the lithographic feature to remove the $SiO_2$ layer and poly-silicon film to obtain a sublithographic pore cell (a nanopore) in the bottom silicon nitride layer. The nanopore is positioned directly above the at least one bottom electrode, the at least one bottom electrode having been previously coated with a monolayer of catalytic material. The nanopore can have a diameter of about 20 nanometers to about 60 nanometers.

The monolayer of catalytic material preferably comprises an element selected from the group consisting of gold, nickel, iron and palladium. The monolayer catalytic material is then annealed to obtain a catalytic seed material for growing nanowires. The seed material has a substantially spherical shape. The temperature of the annealing step is at or above the melting point of the catalytic material. The film of catalytic material, upon annealing, takes on a substantially spherical shape. A nanosphere of catalytic material is thus obtained. Once the nanosphere of catalytic material is obtained, a nanowire of silicon or germanium or the like can be grown by processes known to one of ordinary skill in the art. A phase change memory (PCM) device can then be constructed in a manner as disclosed above in the preceding embodiments of the present invention. The present invention also relates to a phase change memory (PCM) device prepared according to the process as disclosed directly above.

The present invention also relates to a phase change memory (PCM) device prepared according to a process comprising obtaining a middle-of-the-line semiconductor device having at least one active region, and forming a precursor to a phase change memory cell device as an overlayer on the semiconductor device. The precursor comprises a first silicon oxide base layer comprising at least one back electrode embedded therein. A second silicon oxide dielectric layer is formed over the silicon oxide base layer. A thin silicon nitride dielectric layer is then formed over the silicon dioxide dielectric layer. A layer comprising an organic polymeric photoresist is then deposited on top of the thin silicon nitride dielectric layer. A lithographic feature is then patterned over the silicon nitride layer to obtain a patterned substrate. At least one overhang-type pore is then constructed in the patterned substrate. The overhang structure of the pore refers to formation of an overhang of dielectric material at the top of the pore. Preferably, an overhang-type pore is positioned above each bottom electrode. The overhang-type pore extends through the dielectric top layer(s) and downwardly to the upper surface of the bottom electrode. In one embodiment, the formed pores are substantially uniform in size. In an alternative embodiment, the formed pores are not uniform in size. Once the overhang-type pore is formed, a monolayer of catalytic material is deposited on the top of the dielectric layer and the bottom of the pore. The thickness of the monolayer of catalytic material is about 1.5 nanometers to about 2.5 nanometers. The preferred thickness of the catalytic monolayer is about 2.15 nanometers. The catalytic material is a member selected from the group consisting of gold, nickel, iron and palladium. The monolayer of catalytic material does not reach to the sidewalls of the pore because of the overhang of silicon nitride. The overhang of silicon nitride acts as a shadow mask to prevent the catalytic material from reaching the sidewalls of the pore. The monolayer of catalytic material has substantially the same area at the bottom of each of the plurality of pores. The monolayer of catalytic material is then protected with NFC. The NFC protect completely covers the top of the dielectric layer and fills the pore, thus covering the monolayer of catalytic material and forming an NFC protected assembly. NFC refers to a family of fluoropolymers. A first chemical-mechanical polishing (CMP) operation is then performed on the NFC protected assembly to remove substantially of the catalytic material from the areas that are not at the bottom of the overhang-type pore cell. The process then comprises stripping the NFC protect layer. The monolayer of catalytic material at the bottom of each of the pores is then thermally annealed to obtain a ball of catalytic seed material having a substantially spherical shape. The ball of catalytic seed material rests at the bottom of the pore. It is employed to grow a doped nanowire construct comprising a P-N junction. In an alternative embodiment, an un-doped nanowire is grown from the ball of catalyst. When a plurality of pores is employed, then a plurality of nanowires is obtained. A single nanowire is grown in each pore. After formation of the nanowire, an oxide material is employed in a fill-in step. A second CMP step is then performed to obtain a conductive nanowire. The final steps of constructing the phase change material device are: addition of a chalcogenide phase change material, and addition of a top electrode material. The process can provide for the construction of a 3-dimensional contact electrode because the growth of the nanowire is conducted at a relatively low temperature. In one embodiment, the relatively low temperature is about 500 degrees C.

A process for preparing a phase change memory cell device is hereby disclosed. The phase change memory cell device contains a nanowire contact. The process consists essentially of obtaining a middle-of-the-line semiconductor device comprising a silicon wafer having at least one active region; forming a silicon oxide base layer on the device, the base layer comprising at least one bottom electrode embedded in the base layer; and forming a silicon oxide layer on the base layer. The process further includes the step of forming a thin silicon nitride layer on the silicon oxide layer to obtain a laminated middle-of-the-line semiconductor device.

The process further contains the steps of adding a photoresist material over the laminated middle-of-the-line semiconductor device and patterning a lithographic feature on the laminated device. A pore is then constructed directly over the at least one embedded bottom electrode. The pore extends to the back electrode and has an overhang of silicon nitride. The pore has a diameter of about 20 nm. to about 60 nm. The overhang has a length of about 1 nm. to about 5 nm. The overhang acts as a shadow mask. The process further includes the step of depositing a monolayer comprising a catalytic material over the lithographic feature. The catalytic material is a member selected from the group consisting of gold, nickel, iron and palladium. The sidewalls of the pore are not coated with the catalytic material because of the overhang, the overhang acting as a shadow mask.

The monolayer of catalytic material is then protected with a photoresist material such as NFC. The NFC protect covers substantially the entire top of the dielectric layer and also fills the pore. It covers the monolayer of catalytic material and substantially forms an NFC protected assembly. NFC refers to a family of fluoropolymers. The process further includes the step of conducting a first chemical and mechanical polishing (CMP) process. The photoresist material (NFC) is substantially completely stripped from the laminated semiconductor device. Catalytic material is removed from the laminated semiconductor device in substantially all areas EXCEPT the bottom of the pore. A thin layer of catalytic material remains on the bottom of the pore. The layer of catalytic material can have a thickness of about 1.5 nm. to about 2.5 nm.

The process further includes the steps of thermally annealing the layer of catalytic material at a temperature which is at least at the melting point of the catalytic material to obtain a substantially spherical ball of catalytic material. A nanowire is grown from the ball of catalytic material by methods known to one of ordinary skill in the art. The nanowire is a member selected from the group consisting of a silicon nanowire, a germanium nanowire, a doped silicon nanowire and a doped germanium nanowire. The process further includes the steps of depositing a spacer layer over the nanowire, wherein the spacer layer is a member selected from the group consisting of a metal layer and an insulating layer; removing the spacer layer from substantially all areas except the area directly over the nanowire; and depositing a layer of dielectric material over the lithographic feature.

The process further includes the step of conducting a second chemical and mechanical polishing (CMP) process, wherein the dielectric layer and the catalyst material are removed from the top of the nanowire. The top of the nanowire is exposed and the bottom of the nanowire is in contact with the bottom electrode. The process further includes the steps of depositing a layer of phase change material over the lithographic feature, whereby the phase change material is in contact with the top of the nanowire; and constructing a top electrode over the layer of phase change material to obtain the phase change memory cell device. The phase change device includes the nanowire. The presence of the nanowire(s) allows for alternately switching a chalcogenide phase change material from its high resistance (amorphous) state to its low resistance (crystalline) state. A reduced amount of current can be employed because of the presence of the nanowire(s) in the phase change device.

Figure 1:
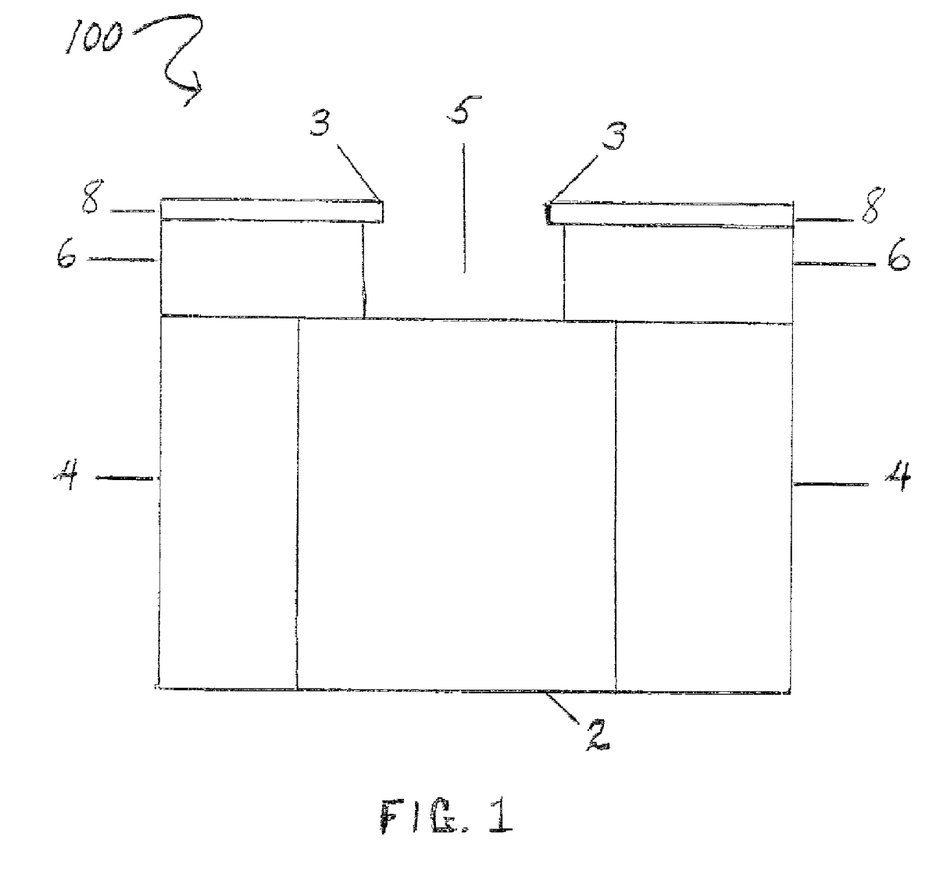
FIG. 1 is a representation of a first precursor for a phase change memory cell, the precursor containing an overhang-type pore.

Referring to FIG. 1, a first precursor 100 for a phase change memory cell is represented. The precursor 100 comprises an overlayer formed on a middle-of-the-line semiconductor device (not shown). A pore 5 is formed by lithographic techniques known to one of ordinary skill in the art. The precursor 100 comprises a thick silicon oxide base layer 4 having embedded therein a bottom electrode 2. In an alternative embodiment, a plurality of bottom electrodes 2 can be embedded in the silicon oxide layer 4. The precursor 100 further comprises a layer of silicon oxide 6 and a thin layer of silicon nitride 8. Prior to the lithographic construction of overhang-type pore 5, the silicon oxide layer 6 and the silicon nitride layer 8 substantially cover the entire surface of silicon oxide base layer 4 with embedded bottom electrode 2. An overhang 3 of the silicon nitride layer 8 remains after lithographic construction of pore 5. Preferably, the overhang 3 is about 2 nanometers in length, and surrounds substantially the entire top of the pore 5.

Figure 2:
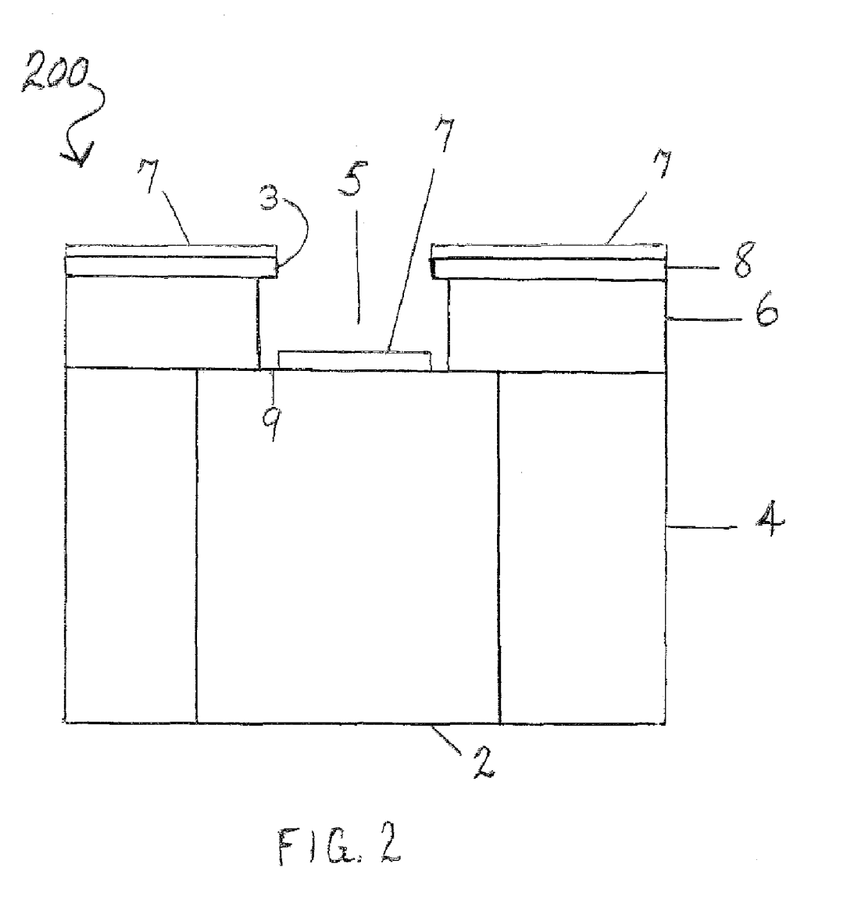
FIG. 2 is representation of a second precursor for a phase change memory cell, the precursor containing an overhang-type pore filled with a monolayer of catalytic material.

Referring to FIG. 2, a second precursor 200 for a phase change memory cell is represented. The precursor 200 comprises an overlayer formed on a middle-of-the-line semiconductor device (not shown). The precursor 200 comprises a silicon oxide base layer 4, a bottom electrode 2, a silicon oxide layer 6, and a thin silicon nitride layer 8. The precursor 200 further comprises an overhang-type pore 5 and a metal layer 7. The metal layer 7 is deposited by a directional monolayer deposition or alternative methods. The thickness of the metal layer 7, which is to act as a catalytic material for growth of a nanowire, is about 1.5 nanometers to about 2.5 nanometers. Because of the overhang 3 in the silicon nitride layer 8, the catalytic metal monolayer 7 is not deposited on the sidewalls of the pore 5. It is confined to the bottom of the pore 5 and to the exposed surface of silicon nitride layer 8. In a preferred embodiment, the catalytic metal layer 7 that rests on the exposed surface of silicon nitride layer 8 is removed in a later step, leaving only the catalytic metal layer 7 at the bottom of the overhang-type pore 5.

Figure 3:
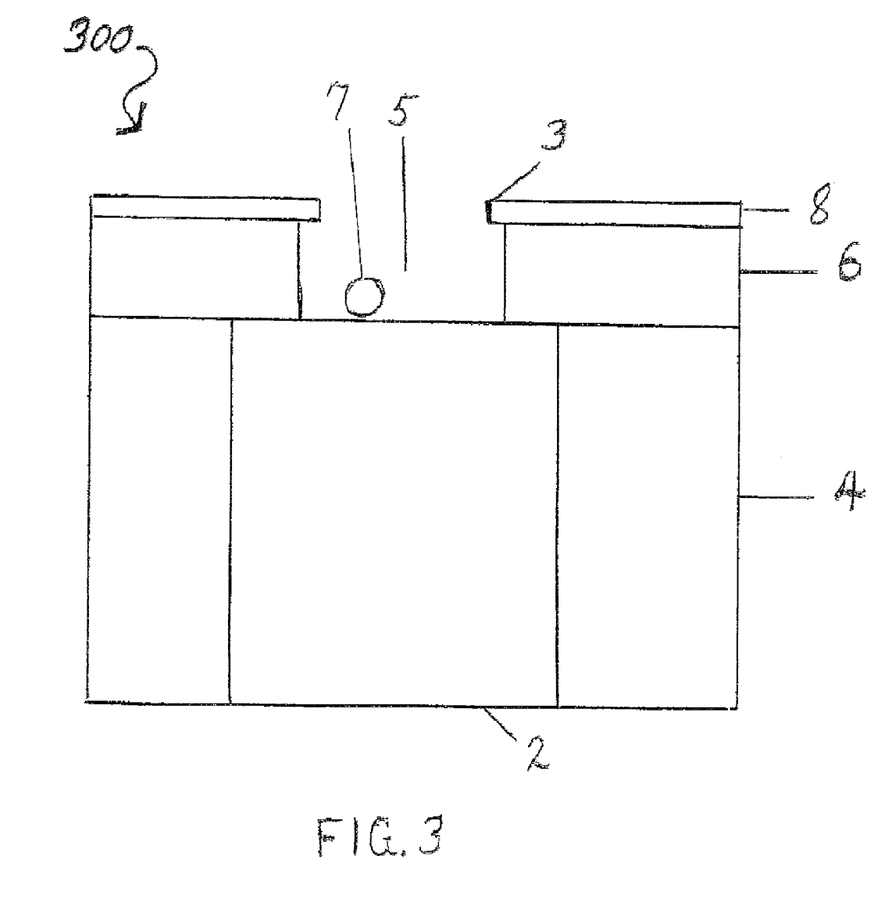
FIG. 3 is a representation of a third precursor for a phase change memory cell, the precursor containing an overhang-type pore containing a spherical ball of catalytic material.

Referring to FIG. 3, a third precursor 300 for a phase change memory cell is represented. The precursor 300 comprises an overlayer formed on a middle-of-the-line semiconductor device (not shown). The precursor 300 comprises a silicon oxide base layer 4, a bottom electrode 2, a silicon oxide layer 6, and a thin silicon nitride layer 8. The precursor 300 further comprises an overhang-type pore 5 and a substantially spherical ball 7 of catalytic material. The spherical ball 7 represents the metal layer 7 after an annealing step. The catalytic ball 7 resides at the bottom of pore 5. The pore 5 has an overhang 3 of the silicon nitride layer 8. The catalytic ball 7 serves as a locus for growth of a nanowire. FIG. 3 therefore is a representation of a precursor 300 for a phase change memory device in condition for growth of a silicon or germanium nanowire.

Figure 4:
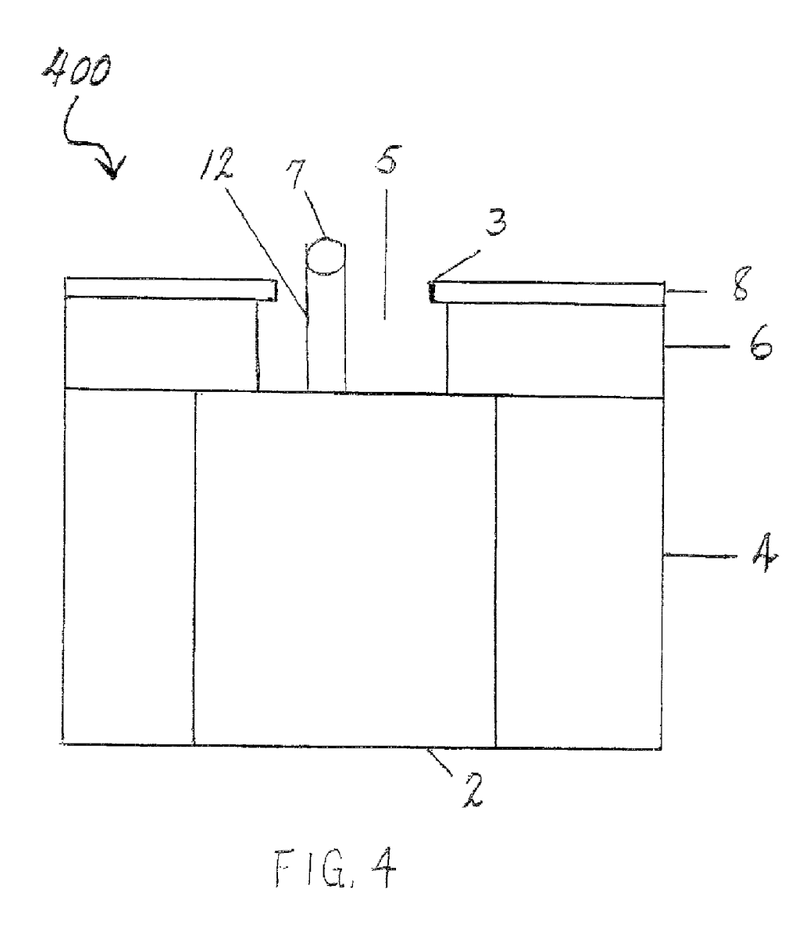
FIG. 4 is a representation of a fourth precursor for a phase change memory cell, the precursor containing an overhang-type pore containing a grown nanowire.

Referring to FIG. 4, a fourth precursor 400 for a phase change memory cell is represented. The precursor 400 comprises an overlayer formed on a middle-of-the-line semiconductor device (not shown). The precursor 400 comprises a silicon oxide base layer 4, a bottom electrode 2, a silicon oxide layer 6, and a thin silicon nitride layer 8. The precursor 400 further comprises an overhang-type pore 5 having an overhang 3 of the silicon nitride layer 8. Within the pore 5 is a catalytic ball 7 that has been employed to grow a nanowire 12. The nanowire 12 is grown by means that are known to one of ordinary skill in the art. Preferably, the nanowire 12 is a silicon nanowire or a germanium nanowire. In a preferred embodiment, the nanowire 12 comprises a doped nanowire containing a P-N junction. Preferably, the method of growth of the nanowire is a low temperature variable doping method of nanowire growth.

Figure 5:
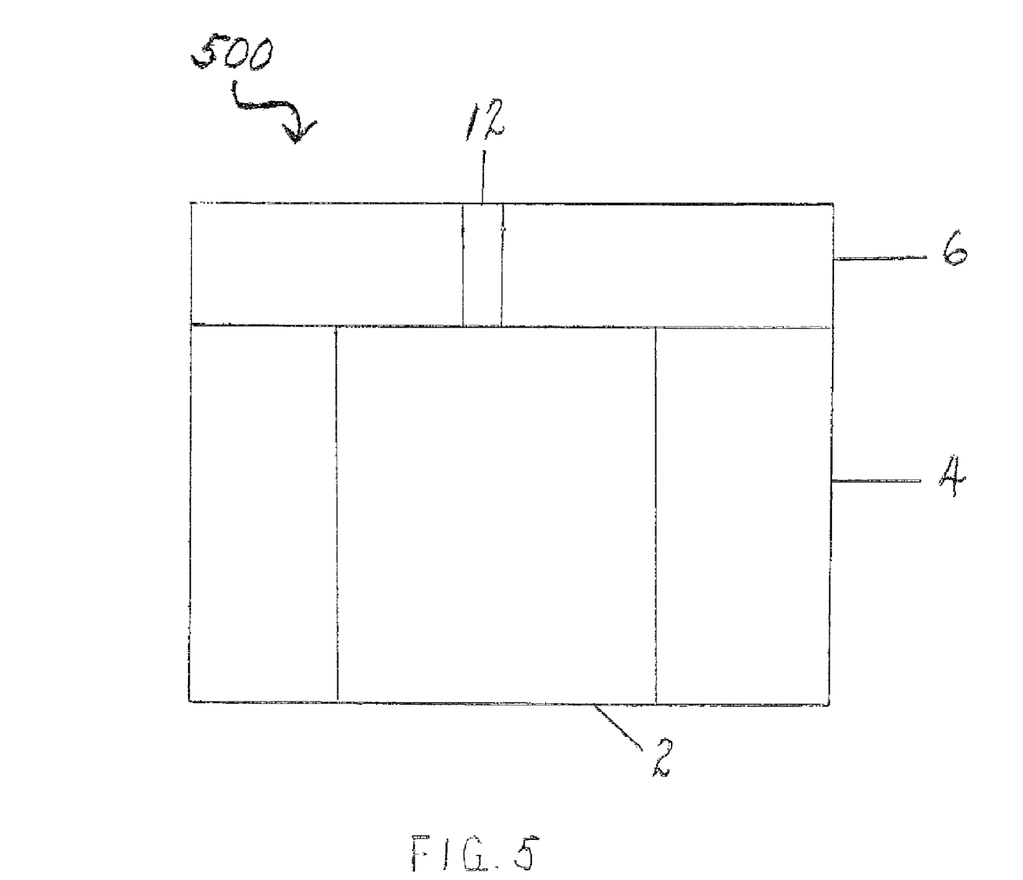
FIG. 5 is a representation of a fifth precursor for a phase change memory cell, the precursor containing a nanowire contact.

Referring to FIG. 5, a fifth precursor 500 for a phase change memory cell is represented. The precursor 500 comprises an overlayer formed on a middle-of-the-line semiconductor device (not shown). The precursor 500 comprises a silicon oxide base layer 4, a bottom electrode 2 and a silicon oxide layer 6. The bottom electrode 2 is embedded in said base layer 4. The precursor 500 further comprises a nanowire contact 12.

Preferably the contact 12 is an electrode or diode. The precursor 500 as represented in FIG. 5 has been subjected to the steps of oxide fill-in and a chemical-mechanical polishing (CMP) operation.

Figure 6:
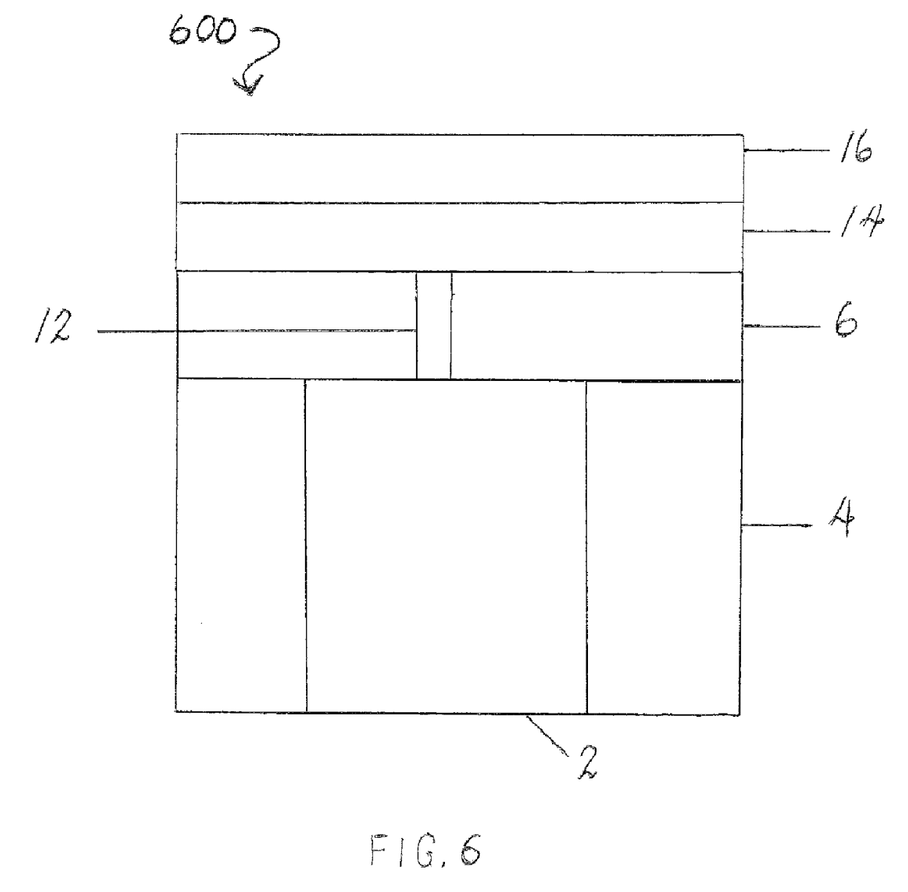
FIG. 6 is a representation of a phase change memory cell having a bottom electrode, a nanowire contact and a top electrode.

Referring to FIG. 6, a phase change memory cell 600 is represented. The phase change memory cell 600 is formed on a middle-of-the-line semiconductor device (not shown). The phase change memory cell 600 comprises a silicon oxide base layer 4, a bottom electrode 2 embedded in base layer 4, a nanowire contact 12, a silicon oxide layer 6, a phase change chalcogenide material layer 14, and a top electrode 16. Preferably, the phase change material is germanium-antimony-tellurium (GST). Other phase change chalcogenide materials can be employed, such as phase change materials based on antimony. The nanowire contact 12 allows for the chalcogenide phase change material to be variably switched from a high resistance (amorphous) state to a low resistance (crystalline) state.

While the invention has been described by specific examples and embodiments, there is no intent to limit the inventive concept except as set forth in the following claim.

We claim:

1. A process for preparing a phase change memory device having a nanowire contact comprising:
   obtaining a middle-of-the-line semiconductor device comprising a silicon wafer having at least one active region;
   forming a silicon oxide base layer on the device, the base layer comprising at least one bottom electrode embedded in the base layer;
   forming a silicon oxide layer on the base layer;
   forming a thin silicon nitride layer on the silicon oxide layer to obtain a laminated middle-of-the-line semiconductor device;
   depositing an organic polymeric photoresist material over the laminated semiconductor device;
   patterning a lithographic feature on the laminated device;
   constructing an overhang-type pore directly over the at least one embedded bottom electrode, the pore extending to the bottom electrode, the overhang consisting essentially of silicon nitride, wherein the overhang-type pore has a diameter of about 20 nm. to about 60 nm., and wherein the overhang has a length of about 1 nm. to about 5 nm.;
   depositing a layer comprising a catalytic material over the lithographic feature, wherein the catalytic material is a member selected from the group consisting of gold, nickel, iron and palladium, whereby the sidewalls of the pore are not coated with the catalytic material because of the overhang, the overhang acting as a shadow mask;
   conducting a first chemical and mechanical polishing (CMP) process, whereby the photoresist material is substantially completely stripped from the laminated semiconductor device, and whereby the catalytic material is removed from the laminated semiconductor device in substantially all areas EXCEPT the bottom of the pore, wherein a thin layer of catalytic material remains on the bottom of the pore, wherein the layer of catalytic material has a thickness of about 1.5 nm. to about 2.5 nm.;
   thermally annealing the layer of catalytic material at a temperature which is at least at the melting point of the catalytic material to obtain a substantially spherical ball of catalytic material;
   growing a nanowire by employing the ball of catalytic material, wherein the nanowire is a member selected from the group consisting of a silicon nanowire, a germanium nanowire, a doped silicon nanowire and a doped germanium nanowire;
   depositing a spacer layer over the nanowire, wherein the spacer layer is a member selected from the group consisting of a metal layer and an insulating layer;
   removing the spacer layer from substantially all areas except the area directly over the nanowire;
   depositing a layer of dielectric material over the lithographic feature;
   conducting a second chemical and mechanical polishing (CMP) process, wherein the dielectric layer and the catalyst material are removed from the top of the nanowire, whereby the top of the nanowire is exposed and the bottom of the nanowire is in contact with the bottom electrode;
   depositing a layer of phase change material over the lithographic feature, whereby the phase change material is in contact with the top of the nanowire; and
   constructing a top electrode over the layer of phase change material to obtain the phase change memory device having the nanowire contact.

* * * * *